(12) United States Patent
Clabes et al.

(10) Patent No.: US 7,044,633 B2
(45) Date of Patent: May 16, 2006

(54) METHOD TO CALIBRATE A CHIP WITH MULTIPLE TEMPERATURE SENSITIVE RING OSCILLATORS BY CALIBRATING ONLY TSRO

(75) Inventors: Joachim Gerhard Clabes, Austin, TX (US); Lawrence Joseph Powell, Jr., Round Rock, TX (US); Daniel Lawrence Stasiak, Rochester, MN (US); Michael Fan Wang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 10/339,758

(22) Filed: Jan. 9, 2003

(65) Prior Publication Data

US 2004/0135643 A1 Jul. 15, 2004

(51) Int. Cl.
*G01K 15/00* (2006.01)
*G01K 7/00* (2006.01)

(52) U.S. Cl. ............................ 374/1; 374/141; 374/177; 374/179; 374/183; 374/185; 327/513; 331/57; 331/74; 331/176; 331/66; 331/175

(58) Field of Classification Search ................ 331/57, 331/74, 176, 66, 175; 374/141, 1, 177, 179, 374/183, 185; 327/513
See application file for complete search history.

(56) References Cited

U.S. PATENT DOCUMENTS

| 4,602,871 | A | | 7/1986 | Hanaoka | |
|---|---|---|---|---|---|
| 4,616,173 | A | | 10/1986 | Cook et al. | |
| 5,098,200 | A | * | 3/1992 | O'Brien et al. | ............. 374/163 |
| 5,553,479 | A | | 9/1996 | Rauchwerger | |
| 5,563,928 | A | * | 10/1996 | Rostoker et al. | ............... 377/20 |
| 5,572,444 | A | | 11/1996 | Lentz et al. | |
| 5,700,090 | A | * | 12/1997 | Eryurek | ...................... 374/210 |
| 5,795,068 | A | | 8/1998 | Conn, Jr. | |
| 5,801,982 | A | | 9/1998 | Blodgett | |
| 5,857,777 | A | | 1/1999 | Schuh | |
| 5,963,103 | A | | 10/1999 | Blodgett | |
| 5,994,970 | A | | 11/1999 | Cole et al. | |
| 6,067,508 | A | * | 5/2000 | Conn, Jr. | ..................... 702/132 |
| 6,157,244 | A | * | 12/2000 | Lee et al. | .................... 327/539 |
| 6,169,442 | B1 | | 1/2001 | Meehan et al. | |
| 6,283,628 | B1 | | 9/2001 | Goodwin | |
| 6,299,346 | B1 | | 10/2001 | Ish-Shalom et al. | |
| 6,377,110 | B1 | | 4/2002 | Cooper | |
| 6,404,246 | B1 | | 6/2002 | Estakhri et al. | |
| 6,604,248 | B1 | | 6/2002 | Estakhri et al. | |
| 6,412,977 | B1 | | 7/2002 | Black et al. | |
| 6,433,405 | B1 | | 8/2002 | Gunderson et al. | |

(Continued)

FOREIGN PATENT DOCUMENTS

| JP | 2-20654 | 6/1990 |
|---|---|---|
| JP | 04-118573 | 4/1992 |
| JP | 05-335490 | 12/1993 |
| JP | 10-239097 | 9/1998 |

OTHER PUBLICATIONS

Greenfield "Using Microprocessors and Microcomputers The 6800 Family" John Wiley and Sons, Inc. 1981 p. 10.*

*Primary Examiner*—Michael B. Shingleton
(74) *Attorney, Agent, or Firm*—Carr LLP; Diana R. Gerhardt

(57) ABSTRACT

The present invention provides a temperature sensitive ring oscillator (TSRO) in an integrated circuit. A temperature measuring device, such as a thermal resistor, is proximate the TSRO, which shares a substantially similar temperature. A memory is employable for storing data that is a function of the output of the TSRO and the temperature measuring device.

18 Claims, 2 Drawing Sheets

U.S. PATENT DOCUMENTS

| | | |
|---|---|---|
| 6,476,682 B1 | 11/2002 | Cole et al. |
| 6,630,872 B1 | 10/2003 | Lanoue et al. |
| 6,674,185 B1 | 1/2004 | Mizuta |
| 6,694,282 B1 | 2/2004 | Perner |
| 6,736,540 B1 | 5/2004 | Sheehan et al. |
| 2002/0181543 A1 | 12/2002 | Yin |
| 2003/0158683 A1 | 8/2003 | Gauthier et al. |
| 2004/0143410 A1 | 7/2004 | Clabes et al. |
| 2004/0190585 A1 | 9/2004 | Berndlmaier et al. |

* cited by examiner

METHOD TO CALIBRATE A CHIP WITH MULTIPLE TEMPERATURE SENSITIVE RING OSCILLATORS BY CALIBRATING ONLY TSRO

TECHNICAL FIELD

The invention relates generally to thermal sensing and, more particularly, to calibrating a thermal sensor in an integrated circuit.

BACKGROUND

Transistors can be used as logical switches in an integrated circuit (IC). Transistors generate heat when switching from an off state to an on state, or from an on state to an off state, within the IC. If this heat is neither properly dissipated nor otherwise accounted or compensated, the transistor can experience degeneration leading to transistor failure.

However, although the IC can have an associated temperature sensor to detect excessive heat, there can be significant variation in the readings obtained from the temperature sensor from IC to IC. Therefore, a calibration of the temperature sensor is performed to compensate for this variation. Conventionally, one method of calibration is to generate a temperature in the IC chip environment and then calibrate the temperature sensor or temperature sensors at that temperature. In other words, determine what the readings of the temperatures sensors are at a given temperature, and use this as a basis for comparison when determining an unknown temperature. However, calibration of temperature sensors can be time intensive and costly.

Therefore, what is needed is a way to calibrate an IC chip that solves at least some of the disadvantages associated with conventional calibration of IC chips.

SUMMARY OF THE INVENTION

The present invention provides an integrated circuit. A temperature sensitive ring oscillator (TSRO) is provided. A temperature measuring device is proximate the TSRO. A memory is employable for storing data that is a function of the output of the TSRO and the temperature measuring device.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
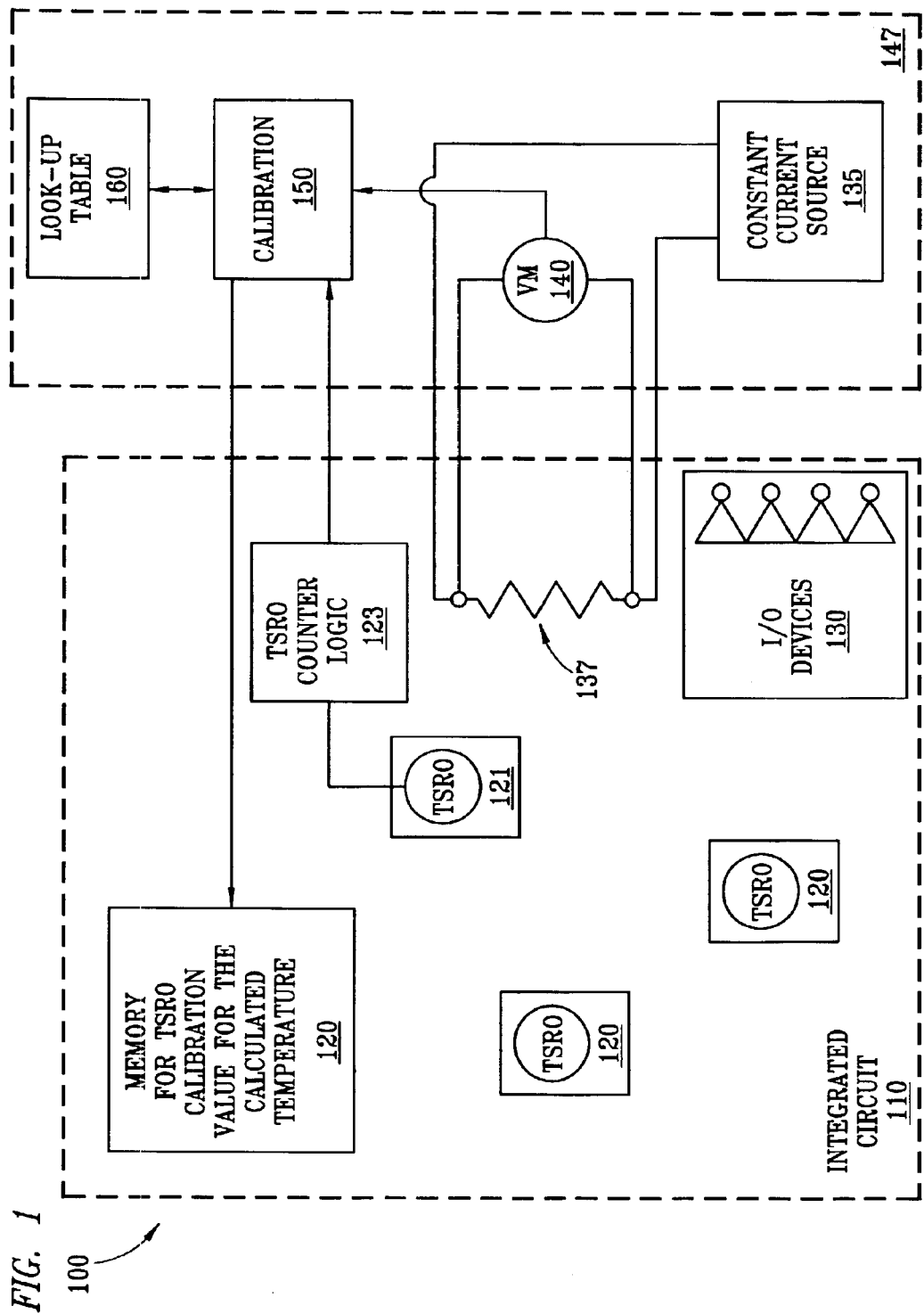
FIG. 1 schematically depicts an integrated circuit comprising a plurality of TSROs and a temperature measuring device.

Turning to FIG. 1, disclosed is an IC calibration system 100. The system 100 has an integrated circuit (IC) 110. The IC 110 has a plurality of temperature sensitive ring oscillators (TSRO) 120. Generally, a ring oscillator consists of a number of gain stages in a feedback loop. With the correct configuration, phase shift, and so on, the output of a ring oscillator oscillates at a certain frequency, determined by the ring oscillator components. A TSRO further employs a temperature sensitive element to affect the characteristics of the oscillation, such as number of oscillation cycles per second. Coupled to a TSRO there can be a TSRO counter logic. Generally, a TSRO counter logic measures the number of oscillations of a TSRO and forwards that information as appropriate. Furthermore, the TSRO counter logic controls aspects of TSRO functionality. In FIG. 1, a TSRO counter logic 123 monitors and controls a TSRO logic 121, and indicia of the numbers of oscillations measured by the TSRO logic counter 123 is forwarded to a calibrator 150.

The IC 110 further comprises input/output (I/O) devices 130. The I/O devices 130 are generally employed to transfer data on and off the IC 110. The thermal resistor 137 is proximate to at least one TSRO 120, which is illustrated as TSRO 121. However, the thermal resistor 137 has its own input and output ports.

The system 100 further comprises a current source 135. The current source is typically not part of the IC 110, Instead, it is part of a tester 147. Generally, the tester 147 determines calibration values for the TSRO 121 and is not integral to each IC 110, but is employable with a plurality of IC 110s. In one embodiment, a constant electrical current from the current source 135 can be routed through an I/O device 130 through the thermal resistor 137. The voltage across the thermal resistor 137 is a function of both the current through the resistor and the resistance of the thermal resistor. The resistance of the thermal resistor is a function of the temperature of the thermal resistor. The TSRO 121 is proximate to the thermal resistor 137. Therefore, in one embodiment, the temperature of the thermal resistor 137 is substantially similar to the temperature of the TSRO 121.

The system 100 further comprises a voltmeter 140 coupled in parallel to the thermal resistor 137. The voltmeter 140 is part of the tester 147. The voltmeter 140 measures the voltage across the thermal resistor 137. The voltage measured by the voltmeter 140 is generally proportional to the temperature of the thermal resistor 137. The TSRO 121, proximate to the thermal resistor 137, has substantially the same temperature, due to their close physical location to one another.

In FIG. 1, the TSRO 121 oscillates at a certain frequency for a given temperature, and indicia of this oscillation frequency value is forwarded to the TSRO counter logic 123. From the TSRO counter logic 123, processed indicia of the frequency count is forwarded to a calibrator 150, part of the tester 147. In an alternative embodiment, an indicia of the oscillation value is forwarded to a memory 170 after being processed by the TSRO counter logic 123. In FIG. 1, indicia of the voltage of the thermal resistor 137 is also forwarded to the calibrator 150. The calibrator 150 employs a look-up table 160, part of the tester 147, to determine the equivalent temperature the thermal resistor 137. The look-up table 160 comprises thermal resistor 137 temperature values corresponding to various voltage values. The voltage values are read from the voltmeter 140, and hence, the temperature of the TSRO 121 is determined.

The TSRO 121 calibration value is then conveyed to the memory 170. The calibration value comprises the determined temperature of the proximate thermal resistor 137. In a further embodiment, the calibration value also comprises the measured frequency of the TSRO 121 as well as the determined temperature of the proximate thermal resistor 137. By storing and employing the TSRO 121 calibration value, it is not necessary to wait until the temperature of the IC 110 is at a predetermined value. Instead, the temperature of the TSRO 121 of the IC 110 is determined, and the calibration of the TSRO 121 occurs at that temperature. In one embodiment, the IC 110 does not remain idle (that is, untested) for the period of time until the temperature of the IC 110 is even over the chip.

In a further embodiment, at least one second TSROs 120 is calibrated with the same calibration value in the memory 170. Generally, the TSROs 120 and the TSRO 121 share similar calibration characteristics because they are fabricated within the same IC. Therefore, the TSROs 120 can employ the same calibration values.

In a still further embodiment, a constant voltage source is employed, and the resulting current through the thermal resistor 137 is measured. The measurement of the current is employed by the calibrator 150 to determine the equivalent temperature of the thermal resistor 137. The frequency of the TSRO 121 is also measured, and both these values are stored in the calibration memory 170.

Figure 2:
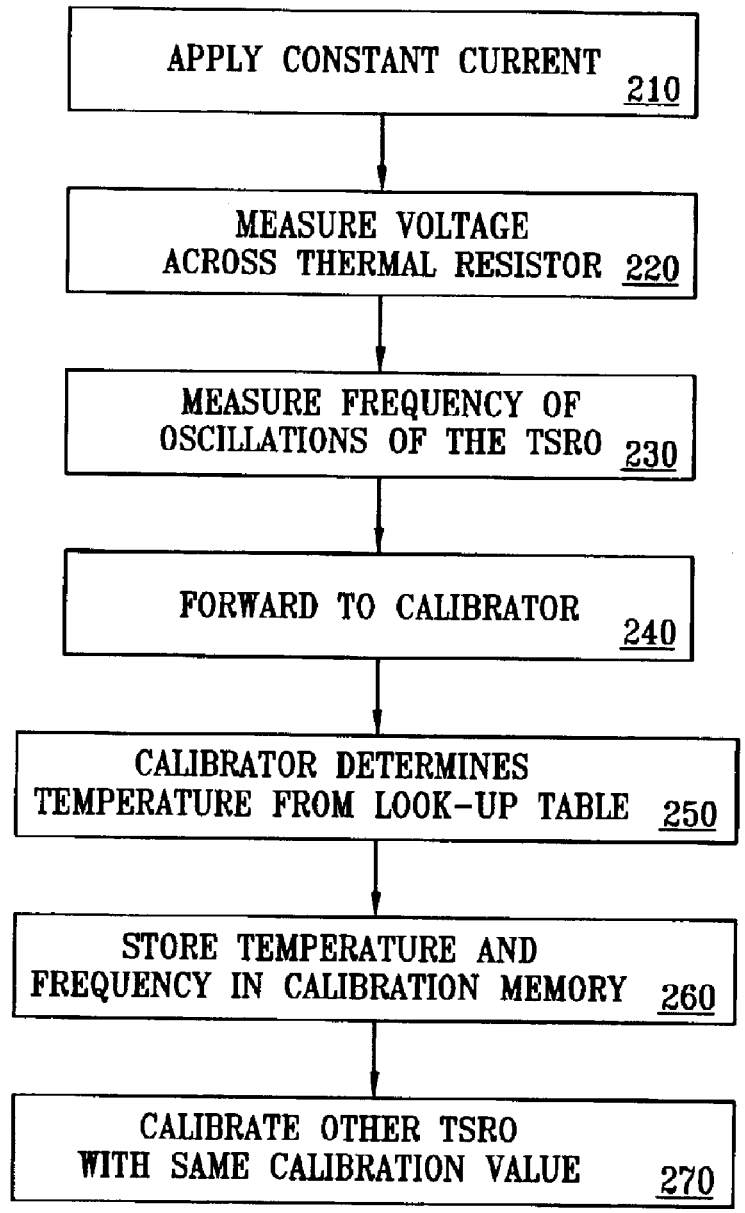
FIG. 2 illustrates a method for calibrating a TSRO.

Turning now to FIG. 2, disclosed is a method for employing the tester 147. In step 210, a known current is generated by the current source 135. In an alternative embodiment, a known voltage is generated by a voltage source. In step 220, the voltage that is generated across the thermal resistor 137 is measured by the voltmeter 140. In an alternative embodiment, the current that flows through the resistor 137 is measured by an ampere meter. In step 230, the frequency of oscillations of the TSRO are measured. In step 240, this indicia is processed by the TSRO counter logic 123, and the processed indicia is then forwarded to the calibrator 150.

In step 250, the calibrator 150 employs the look-up table 160 to determine the corresponding temperature. The temperature and the oscillator frequency are both stored in the memory 170 for calibration of the TSRO 121. In step 260, the TSRO 121 oscillation value and the equivalent look-up table temperature are stored in the memory 170. In step 270, the calibration value stored for the TSRO 121 is also associated with the calibration values of the other TSROs 120.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. A system for calibrating at least one of a plurality of TSROs on an IC chip with a temperature measuring device, comprising:
    a current source;
    a voltmeter coupleable to the temperature measuring device; and
    a calibrator for combining the signal generated by the voltmeter with a frequency output of one of the TSROs, the calibrator further employable to generate a calibration value; and
    a processor for calibrating any others of the plurality of TSROs in response to the calibration value.

2. The system of claim 1, further comprising a look-up table employable by the calibrator.

3. The system of claim 1, further comprising a memory for storing the calibration value.

4. The system of claim 1, wherein the calibration value comprises indicia of a calculated temperature and indicia of the frequency of oscillations of the TSRO.

5. A system for calibrating at least one of a plurality of TSROs on an IC chip with a temperature measuring device, comprising:
    a voltage source;
    a current reader coupleable to the temperature measuring device; and
    a calibrator for combining the signal generated by the current meter with a frequency output of one of the TSROs, the calibrator further employable to generate a calibration value; and
    a processor for calibrating any others of the plurality of TRSOs in response to the calibration value.

6. The system of claim 5, further comprising a look up table employable by the calibrator.

7. The system of claim 5, further comprising a memory for storing the calibration value.

8. The system of claim 5, wherein the calibration value comprises indicia of a calculated temperature and indicia of the frequency of oscillations of the TSRO.

9. A method for determining a calibration value for a TSRO and calibrating at least one of a plurality of TSROs comprising:
    applying a current to a temperature measuring element;
    creating a resulting voltage across the temperature measuring element;
    measuring the resulting voltage across the temperature element;
    measuring the frequency of oscillation of the TSRO;
    forwarding indicia of the voltage to a calibrator;
    employing the measured voltage to determine a corresponding temperature;
    forwarding indicia of the frequency of oscillation and indicia of the determined corresponding temperature to a memory; and using the frequency value and the temperature value to calibrate at least one of the plurality of TSROs without a heating element or a cooling element.

10. The method of claim 9, wherein the step of measuring a voltage further comprises measuring a voltage across a thermal resistor.

11. The method of claim 9, wherein the step of applying a current further comprises applying a substantially constant current.

12. The method of claim 9, wherein the step of employing the measured voltage to determine a corresponding temperature further comprises employing a look-up table.

13. The method of claim 9, further comprising a step of employing the calibration values in memory to calibrate a plurality of TSROs.

14. A method for determining a calibration value for a TSRO and calibrating at least one of a plurality of TSROs, comprising:
applying a voltage to a temperature measuring element;
creating a resulting current through the temperature measuring element;
measuring the resulting current through the temperature element;
measuring the frequency of oscillation of the TSRO;
forwarding indicia of the voltage to a calibrator;
employing the measured current to determine a corresponding temperature;
forwarding indicia of the frequency of oscillation and indicia of the determined corresponding temperature to a memory; and
using the frequency value and the temperature value to calibrate at least one of the plurality of TSROs without a heating element or a cooling element.

15. A computer program product for determining a calibration value for a TSRO and calibrating at least one of a plurality of TSROs, the computer program product having a medium with a computer program embodied thereon, the computer program comprising:
computer code for applying a current;
computer code for creating a voltage across a temperature element;
computer code for measuring the voltage across the temperature element;
computer code for measuring the frequency of oscillation of the TSRO;
computer code for forwarding indicia of the voltage to a calibrator;
computer code for employing the measured voltage to determine a corresponding temperature;
computer code for forwarding indicia of the frequency of oscillation and indicia of the determined corresponding temperature to a memory; and
computer code for using the frequency value and the temperature value to calibrate at least one of the plurality of TSROs without a heating element or a cooling element.

16. A processor for determining a calibration value for a TSRO and calibrating at least one of a plurality of TSROs, the processor including a computer program comprising:
computer code for applying a current;
computer code for creating a voltage across a temperature element;
computer code for measuring the voltage across the temperature element;
computer code for measuring the frequency of oscillation of the TSRO;
computer code for forwarding indicia of the voltage to a calibrator;
computer code for employing the measured voltage to determine a corresponding temperature;
computer code for forwarding indicia of the frequency of oscillation and indicia of the determined corresponding temperature to a memory; and
computer code for using the frequency value and the temperature value to calibrate at least one of the plurality of TSROs without a heating element or a cooling element.

17. A computer program product for determining a calibration value for a TSRO and calibrating at least one of a plurality of TSROs, the computer program product having a medium with a computer program embodied thereon, the computer program comprising:
computer code for applying a voltage to a temperature measuring element;
computer code for creating a resulting current through the temperature measuring element;
computer code for measuring the resulting current through the temperature element;
computer code for measuring the frequency of oscillation of the TSRO;
computer code for forwarding indicia of the voltage to a calibrator;
computer code for employing the measured current to determine a corresponding temperature;
computer code for forwarding indicia of the frequency of oscillation and indicia of the determined corresponding temperature to a memory; and
computer code for using the frequency value and the temperature value to calibrate at least one of the plurality of TSROs without a heating element or a cooling element.

18. A processor for determining a calibration value for a TSRO and calibrating at least one of a plurality of TSROs, the processor including a computer program comprising:
computer code for for applying a voltage to a temperature measuring element;
computer code for creating a resulting current through the temperature measuring element;
computer code for measuring the resulting current through the temperature element;
computer code for measuring the frequency of oscillation of the TSRO;
computer code for forwarding indicia of the voltage to a calibrator;
computer code for employing the measured current to determine a corresponding temperature;
computer code for forwarding indicia of the frequency of oscillation and indicia of the determined corresponding temperature to a memory; and
computer code for using the frequency value and the temperature value to calibrate at least one of the plurality of TSROs without a heating element or a cooling element.

* * * * *